United States Patent
Lee et al.

(10) Patent No.: US 12,557,512 B2
(45) Date of Patent: Feb. 17, 2026

(54) DISPLAY PANEL, METHOD FOR ADJUSTING A VIEWING ANGLE OF THE DISPLAY PANEL AND DISPLAY DEVICE

(71) Applicant: LG Display Co., Ltd., Seoul (KR)

(72) Inventors: Kwangmin Lee, Suwon-si (KR); Dahye Ha, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 477 days.

(21) Appl. No.: 17/973,361

(22) Filed: Oct. 25, 2022

(65) Prior Publication Data
US 2023/0189603 A1   Jun. 15, 2023

(30) Foreign Application Priority Data
Dec. 10, 2021 (KR) .......................... 10-2021-0176308

(51) Int. Cl.
*H10K 59/35* (2023.01)
*H10K 50/844* (2023.01)
*H10K 59/122* (2023.01)

(52) U.S. Cl.
CPC ......... *H10K 59/353* (2023.02); *H10K 50/844* (2023.02); *H10K 59/122* (2023.02)

(58) Field of Classification Search
CPC .... H10K 50/844; H10K 59/122; H10K 59/35; H10K 59/353; H10K 59/50
See application file for complete search history.

(56) References Cited

U.S. PATENT DOCUMENTS

2019/0162990 A1   5/2019  Nishimura et al.
2020/0033689 A1*  1/2020  Lee ....................... G02F 1/1323
(Continued)

FOREIGN PATENT DOCUMENTS

CN   110794628 A     2/2020
KR   10-2195645 B1  12/2020
(Continued)

OTHER PUBLICATIONS

China National Intellectual Property Administration, Office Action, Chinese Patent Application No. 202211308793.4, Jul. 30, 2025, 17 pages.
(Continued)

*Primary Examiner* — Shaun M Campbell
(74) *Attorney, Agent, or Firm* — Fenwick & West LLP

(57) ABSTRACT

Disclosed are a display panel, a method for adjusting a viewing angle of the display panel and a display device including the display panel. The display panel includes a plurality of pixels, wherein each of the plurality of pixels includes the plurality of sub-pixels; a bank defining a plurality of light-emitting areas corresponding to a plurality of sub-pixels; a plurality of lower electrodes disposed on the bank and extending in a first direction and along a boundary between the plurality of pixels; a plurality of light control posts disposed on the lower electrodes, wherein the plurality of light control posts is disposed around each of the plurality of pixels so as to control propagation of light; a first encapsulation layer surrounding the plurality of light control posts; a plurality of upper electrodes disposed on the plurality of light control posts and the first encapsulation layer, wherein the plurality of upper electrodes extends in a second direction intersecting the first direction and along a boundary between the plurality of pixels; and a second encapsulation layer covering the plurality of upper electrodes and the first encapsulation layer.

18 Claims, 12 Drawing Sheets

(56) References Cited

U.S. PATENT DOCUMENTS

| | | |
|---|---|---|
| 2020/0050033 A1 | 2/2020 | Galwaduge et al. |
| 2020/0170087 A1* | 5/2020 | Sato ...................... G02F 1/1323 |
| 2021/0074779 A1 | 3/2021 | Park |
| 2022/0291780 A1* | 9/2022 | Kim ....................... H10K 59/40 |
| 2022/0397801 A1* | 12/2022 | Park ....................... G02B 26/08 |

FOREIGN PATENT DOCUMENTS

| | | |
|---|---|---|
| KR | 10-2021-0066327 A | 6/2021 |
| KR | 10-2021-0069293 A | 6/2021 |

OTHER PUBLICATIONS

Korean Intellectual Property Office, Notice of Allowance, Korean Patent Application No. 10-2021-0176308, Aug. 2, 2025, three pages.

\* cited by examiner

DISPLAY PANEL, METHOD FOR ADJUSTING A VIEWING ANGLE OF THE DISPLAY PANEL AND DISPLAY DEVICE

CROSS-REFERENCE TO RELATED APPLICATION

This application claims priority from Korean Patent Application No. 10-2021-0176308 filed on Dec. 10, 2021 in the Korean Intellectual Property Office, and all the benefits accruing therefrom under 35 U.S.C. 119, the contents of which in its entirety are herein incorporated by reference.

TECHNICAL FIELD

The present disclosure relates to a display panel, and more specifically, to a display panel that may control a viewing angle thereof.

DESCRIPTION OF RELATED ART

As society enters a full-fledged information age, various display devices that process and display a large amount of information have been developed. A flat panel display device including a liquid crystal display device (LCD), an organic light-emitting display device (OLED), and a quantum dot display device (QD) are on the spotlight.

Recently, research on thin and light display panels has been actively conducted. A flexible display device in which a display panel may be curved or folded is also being supplied.

The flexible display device is used in a wide variety of information devices such as televisions, monitors, smart phones, tablet PCs, notebook computers, and wearable devices.

Further, various vehicle display devices such as a digital dashboard (or cluster), a central information display (CID), and a rear seat entertainment (RSE) display are also used in vehicles such as cars. A flexible display device is used in these various display devices for vehicles. In this regard, research is being conducted to integrate the digital dashboard and the central information display into one display using a flexible display that may be implemented in various shapes.

In one example, in order to prevent an image of the display device from being reflected on a vehicle's windshield to obstruct a driver's view while the driver is driving a separate light control film to limit ta vertical viewing angle is attached to a surface of a display panel.

Further, as use of a portable information device increases, the light control film that may cut off a horizontal viewing angle is attached to the surface of the display panel for digital privacy protection and personal information protection.

SUMMARY

Attaching the light control film to the surface of the display panel may cause a problem in that luminance of the display panel decreases due to decrease in transmittance. Further, the light control film may only control either the vertical viewing angle or the horizontal viewing angle. Further, it is impossible to arbitrarily adjust the viewing angle after the light control film is attached thereto. Further, there is a problem that image quality deteriorates due to irregular spots resulting from a step (a height difference between a non-transparent portion and a transparent portion) in the light control film that occurs during a manufacturing process.

Therefore, there is a need for a display panel that may control the viewing angle thereof without attaching the light control film to the surface of the display panel.

A purpose according to an embodiment of the present disclosure is to provide a display panel capable of controlling the viewing angle thereof without loss of luminance.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

A display panel according to one embodiment of the present disclosure includes a plurality of pixels, wherein each of the plurality of pixels includes a plurality of sub-pixels: a bank defining a plurality of light-emitting areas corresponding to the plurality of sub-pixels: a plurality of lower electrodes disposed on the bank and extending in a first direction and along a boundary between the plurality of pixels: a plurality of light control posts disposed on the lower electrodes, wherein the plurality of light control posts are disposed around each of the plurality of pixels so as to control propagation of light: a first encapsulation layer surrounding the plurality of light control posts: a plurality of upper electrodes disposed on the plurality of light control posts and the first encapsulation layer, wherein the plurality of upper electrodes extend in a second direction intersecting the first direction and along a boundary between the plurality of pixels; and a second encapsulation layer covering the plurality of upper electrodes and the first encapsulation layer.

A display panel according to another embodiment of the present disclosure includes: a plurality of pixels: a passivation layer covering organic light-emitting elements respectively disposed in the plurality of pixels: a plurality of lower electrodes disposed on the passivation layer and extending in a first direction and along a boundary between the plurality of pixels: a plurality of upper electrodes extending in a second direction intersecting the first direction and along the boundary between the plurality of pixels: a plurality of light control posts respectively disposed between the plurality of lower electrodes and the plurality of upper electrodes and in areas where the plurality of lower electrodes and the plurality of upper electrodes intersect each other, wherein the plurality of light control posts control propagation of light: a first encapsulation layer disposed under the plurality of upper electrodes and surrounding the plurality of light control posts; and a second encapsulation layer covering the plurality of upper electrodes and the first encapsulation layer.

According to an embodiment of the present disclosure, it is not necessary to attach a separate light control film in order to adjust the viewing angle. Thus, a thin display panel with improved luminance and image quality may be provided.

According to an embodiment of the present disclosure, the light control posts that may adjust light blocking characteristics based on the applied voltage may be disposed around the pixels. Thus, the display panel capable of adjusting the viewing angle may be provided.

According to an embodiment of the present disclosure, the light control posts may be disposed between the lower electrodes and the upper electrodes to which the voltage may be selectively applied, such that the vertical viewing angle, the horizontal viewing angle, or the vertical and horizontal viewing angle of the display panel may be adjusted, and the viewing angle of the display panel may be adjusted for each area.

Effects of the present disclosure are not limited to the above-mentioned effects, and other effects as not mentioned will be clearly understood by those skilled in the art from following descriptions.

DETAILED DESCRIPTIONS

Figure 1:
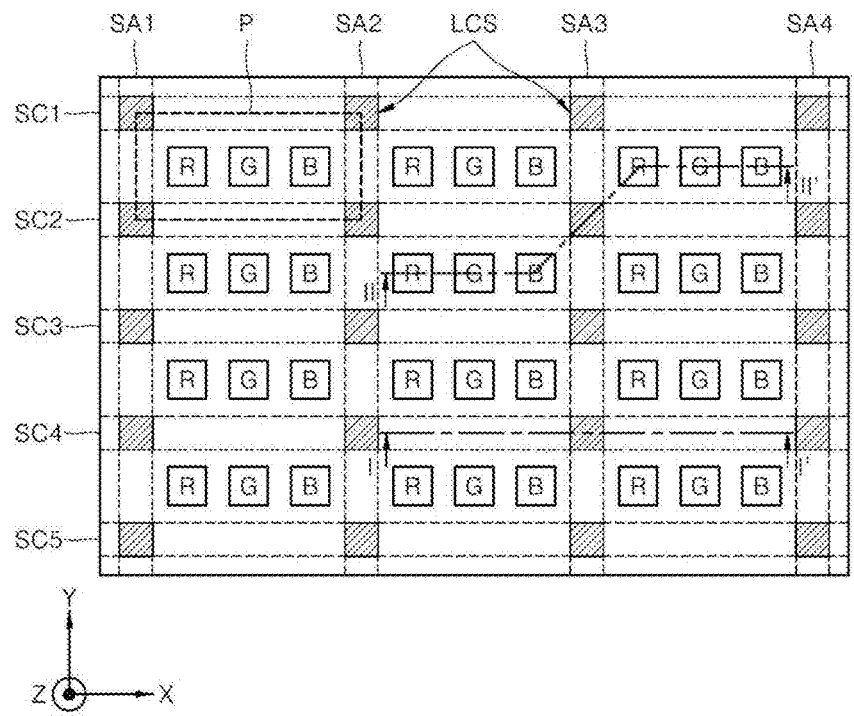
FIG. 1 is a plan view showing a display panel according to one embodiment of the present disclosure.

Advantages and features of the present disclosure, and a method of achieving the advantages and features will become apparent with reference to embodiments described later in detail together with the accompanying drawings. However, the present disclosure is not limited to embodiments as disclosed below, but may be implemented in various different forms. Thus, these embodiments are set forth only to make the present disclosure complete, and to completely inform the scope of the present disclosure to those of ordinary skill in the technical field to which the present disclosure belongs.

A shape, a size, a ratio, an angle, a number, etc. disclosed in the drawings for describing an embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, display panels according to embodiments of the present disclosure will be described in detail with reference to the accompanying drawings.

Figure 2A:
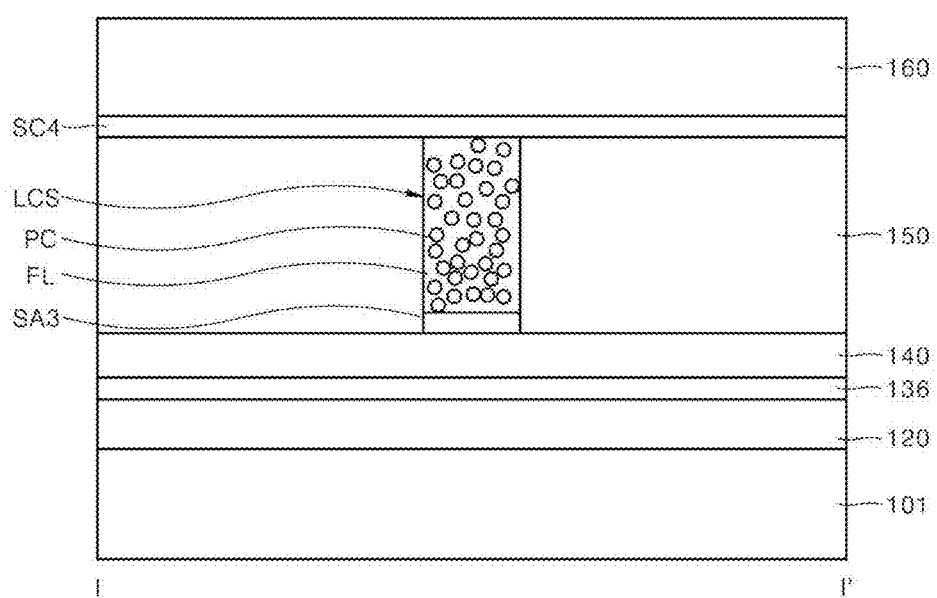
FIG. 2A and FIG. 2B are cross-sectional views showing a narrow viewing angle state of a display panel according to one embodiment of the present disclosure.
Figure 2B:
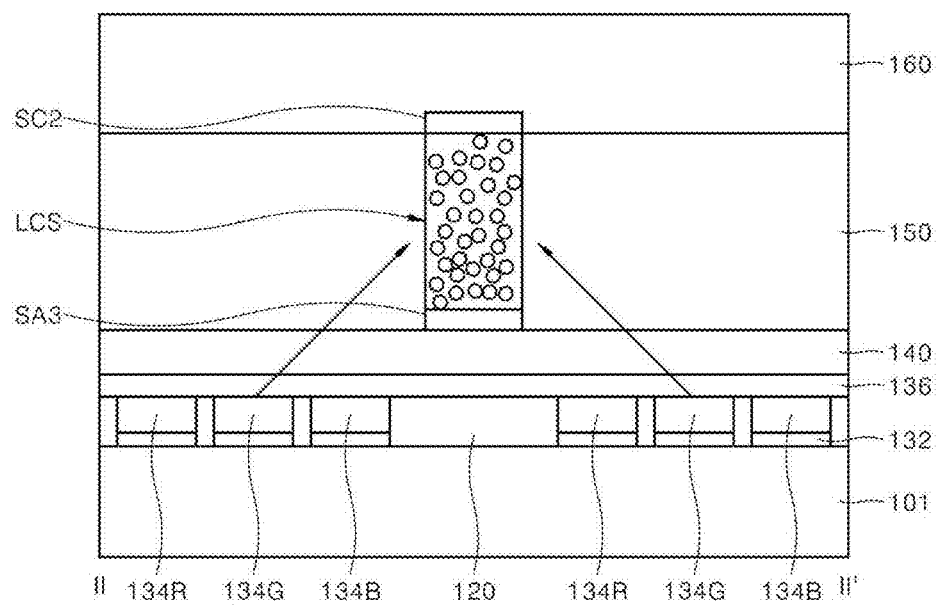
Figure 3:
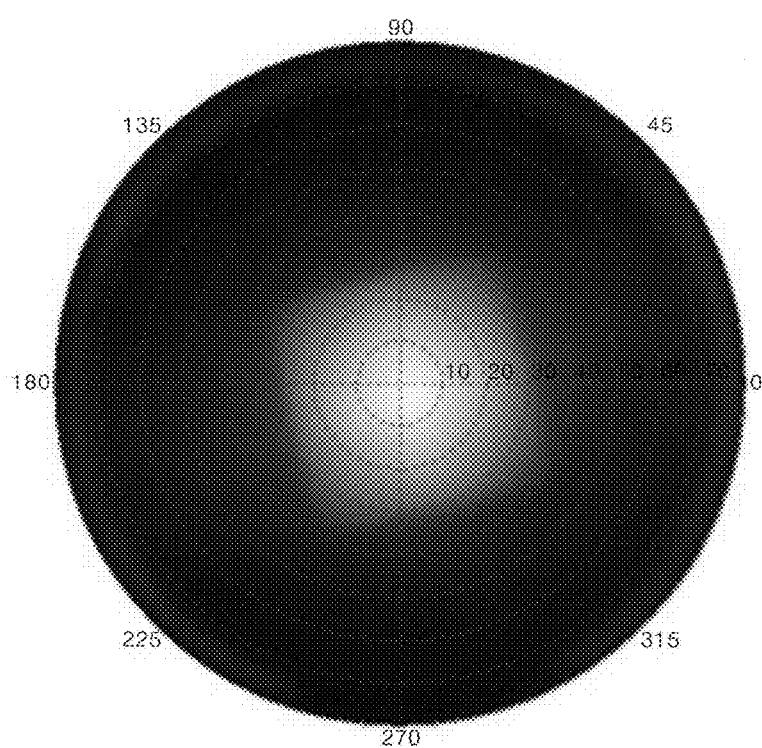
FIG. 3 shows a light profile of a display panel according to one embodiment of the present disclosure.

FIG. 1 is a plan view showing a display panel 10 according to one embodiment of the present disclosure. FIG. 2A and FIG. 2B are cross-sectional views showing a narrow viewing angle state of the display panel 10 according to one embodiment of the present disclosure. FIG. 3 shows a light profile of the display panel 10 according to one embodiment of the present disclosure.

Referring to FIG. 1, FIG. 2A and FIG. 2B, the display panel 10 according to an embodiment of the present disclosure includes a plurality of pixels P, and each pixel P includes a plurality of sub-pixels, for example, red (R), green (G), and blue (B) sub-pixels. Moreover, the display panel 10 according to an embodiment of the present disclosure may include a substrate 101, a bank 120, pixel electrodes 132, red organic light-emitting layers 134R, green organic light-emitting layers 134G, blue organic light-emitting layers 134B, a common electrode 136, a passivation layer 140, lower electrodes SA1, SA2, SA3, and SA4, upper electrodes SC1, SC2, SC3, SC4, and SC5, light control posts LCS, a first encapsulation layer 150 and a second encapsulation layer 160.

The pixel electrode 132, the red light-emitting layer 134R, and the common electrode 136 may constitute a red organic light-emitting element. The pixel electrode 132, the green light-emitting layer 134G, and the common electrode 136 may constitute a green organic light-emitting element. The pixel electrode 132, the blue light-emitting layer 134G, and the common electrode 136 may constitute a blue organic light-emitting element.

The substrate 101 may be embodied as a glass substrate or a plastic substrate. A thin-film transistor layer may be formed on the substrate 101. The thin-film transistor layer may include gate lines, data lines, and thin-film transistors connected thereto. A scan thin-film transistor and a driving thin-film transistor may be disposed on the substrate 101 and in each sub-pixel. In each sub-pixel, a source electrode or a drain electrode of each driving thin-film transistor may be connected to the pixel electrode 132. When a gate driver is formed in a GIP (gate driver in panel) scheme, the gate driver together with the thin-film transistor layer may be disposed on one edge or each of both opposing edges of the substrate 101.

One pixel electrode 132 may be disposed on the substrate 101 and for each sub-pixel. When each pixel P includes three sub-pixels, for example, red (R), green (G), and blue (B) sub-pixels, each pixel P includes three pixel electrodes 132. The pixel electrode 132 may be made of a highly reflective metal material such as Ti/Al/Ti as a stack structure of aluminum and titanium, ITO/Al/ITO as a stack structure of aluminum and ITO, APC alloy, or ITO/APC/ITO as a stack structure of APC alloy and ITO. The APC alloy refers to an alloy of silver (Ag), palladium (Pd), and copper (Cu).

The bank 120 including openings respectively exposing the pixel electrodes 132 may be disposed on the substrate 101. The bank 120 may cover edges of the pixel electrodes 132. The openings of the bank 120 may respectively define light-emitting areas of the sub-pixels. The bank 120 may be made of an organic material such as acryl resin, epoxy resin, phenolic resin, polyamide resin, polyimide resin, etc.

The organic light-emitting layers may be formed in the openings of the bank 120. The red organic light-emitting layer 134R, the green organic light-emitting layer 134G and the blue organic light-emitting layer 134B may be formed in the openings of the bank 120 and for each pixel P. The red organic light-emitting layer 134R may emit red light, the green organic light-emitting layer 134G may emit green light, and the blue organic light-emitting layer 134B may emit blue light.

The common electrode 136 is disposed on the bank 120 and the organic light-emitting layers 134R, 134G, and 134B. The common electrode 136 may transmit light and may be made of a transparent conductive oxide such as ITO or IZO, or a semi-transmissive conductive material such as magnesium (Mg), silver (Ag), or an alloy of magnesium (Mg) and silver (Ag).

The passivation layer 140 may be disposed on the common electrode 136. The passivation layer 140 may be composed of an organic insulating layer or an inorganic insulating layer.

The lower electrodes SA1, SA2, SA3, and SA4 may be disposed on the passivation layer 140 and may extend in a first direction, for example, in a Y-axis direction and along a boundary between the pixels P. The lower electrodes SA1, SA2, SA3, and SA4 may act as, for example, anodes independently and selectively operating. FIG. 1 shows, by way of example, four lower electrodes SA1, SA2, SA3, and SA4, that is, the first lower electrode SA1, the second lower electrode SA2, the third lower electrode SA3 and the fourth lower electrode SA4. However, the disclosure is not limited thereto. A positive voltage may be applied only to selected electrode among the first lower electrode SA1, the second lower electrode SA2, the third lower electrode SA3, and the fourth lower electrode SA4. Alternatively, all of the first lower electrode SA1, the second lower electrode SA2, the third lower electrode SA3 and the fourth lower electrode SA4 may be selected and the positive voltage may be applied thereto. Alternatively, any one of the first lower electrode SA1, the second lower electrode SA2, the third lower electrode SA3 and the fourth lower electrode SA4 may not be selected. Alternatively, some of the first lower electrode SA1, the second lower electrode SA2, the third lower electrode SA3, and the fourth lower electrode SA4 may be selected and a positive voltage may be applied thereto, while the remainder thereof may not be selected.

The lower electrodes SA1, SA2, SA3, and SA4 may be electrically isolated from the common electrode 136 by the passivation layer 140.

The light control posts LCS may be respectively disposed on the lower electrodes SA1, SA2, SA3, and SA4, and may be disposed around the pixels P. The light control posts LCS may be disposed at corners of the pixels P, respectively. The light control posts LCS may control propagation of light emitted from the pixels P. Each of the light control posts LCS may include fine particles PC that are charged and block light and transparent fluid FL. The fine particles PC may, for example, be negatively charged. The fine particles PC may include carbon black particles or pigment particles of various colors. The transparent fluid FL may include a transparent organic solvent, silicon oil, etc.

The first encapsulation layer 150 may be disposed on the passivation layer 140 and may surround a side surface of each of the light control posts LCS. The first encapsulation layer 150 may have openings defined therein in which the light control posts LCS are disposed, respectively. A shape of each of the light control posts LCS may be defined based on a shape of each of the openings defined in the first encapsulation layer 150. Each of the openings of the first encapsulation layer 150 may partially expose each of the lower electrodes SA1, SA2, SA3, and SA4. The first encapsulation layer 150 may be composed of an organic layer, an inorganic layer, or a stack structure thereof.

The upper electrodes SC1, SC2, SC3, SC4, and SC5 may be disposed on the light control posts LCS and the first encapsulation layer 150 and may extend along the boundary between the pixels P, and in a second direction, for example, in an X-axis direction, which may intersect the first direction, for example, the Y-axis direction. The upper electrodes SC1, SC2, SC3, SC4, and SC5 may act as, for example, independently and selectively operating cathodes. In FIG. 1, by way of example, five upper electrodes SC1, SC2, SC3, SC4, and SC5, that is, the first upper electrode SC1, the second upper electrode SC2, the third upper electrode SC3, the fourth upper electrode SC4 and the fifth upper electrode SC5 are shown. The disclosure is not limited thereto. A negative voltage may be applied only to a selected electrode among the first upper electrode SC1, the second upper electrode SC2, the third upper electrode SC3, the fourth upper electrode SC4, and the fifth upper electrode SC5. All of the first upper electrode SC1, the second upper electrode SC2, the third upper electrode SC3, the fourth upper electrode SC4, and the fifth upper electrode SC5 may be selected and a negative voltage may be applied to the selected electrodes. Alternatively, any one of the first upper electrode SC1, the second upper electrode SC2, the third upper electrode SC3, the fourth upper electrode SC4, and the fifth upper electrode SC5 may not be selected. Some of the first upper electrode SC1, the second upper electrode SC2, the third upper electrode SC3, the fourth upper electrode SC4, and the fifth upper electrode SC5 may be selected and a negative voltage is applied thereto, while the remainder thereof may not be selected.

In areas where the upper electrodes SC1, SC2, SC3, SC4 and SC5 and the lower electrodes SA1, SA2, SA3 and SA4 intersect with each other, the light control posts LCS may be disposed respectively. In this regard, each of the light control posts LCS may be disposed between each of the upper electrodes SC1, SC2, SC3, SC4 and SC5 and each of the lower electrodes SA1, SA2, SA3, and SA4.

While any one of the lower electrodes SA1, SA2, SA3 and SA4 and the upper electrodes SC1, SC2, SC3, SC4, and SC5 are not selected, the fine particles PC may be dispersed in the transparent fluid FL, as shown in FIGS. 2A and 2B.

Therefore, the fine particles PC in the light control posts LCS may block the light emitted from the pixels P in a lateral direction. Thus, the display panel 10 according to one embodiment of the present disclosure may have a narrow viewing angle (a cutoff angle may be about 30 degrees) in both the vertical viewing angle and the horizontal viewing angle as shown in FIG. 3.

The second encapsulation layer 160 may cover the upper electrodes SC1, SC2, SC3, SC4 and SC5 and the first encapsulation layer 150. The second encapsulation layer 160 may be composed of an organic layer, an inorganic layer, or a stack structure thereof.

Figure 4A:
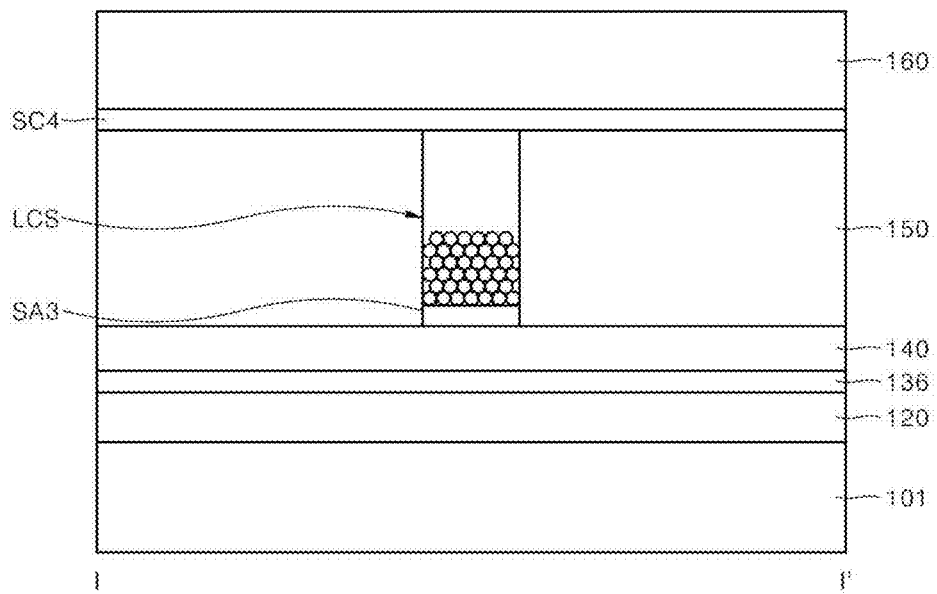
FIG. 4A and FIG. 4B are cross-sectional views showing a wide viewing angle state of a display panel according to one embodiment of the present disclosure.
Figure 4B:
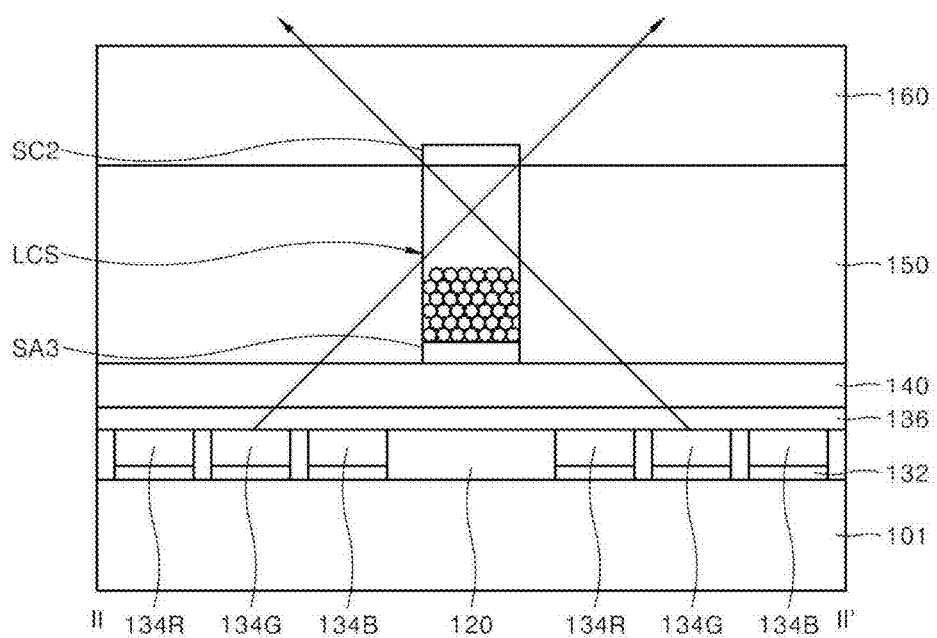

FIG. 4A and FIG. 4B are cross-sectional views showing a wide viewing angle state of the display panel 10 according to one embodiment of the present disclosure.

Referring to FIG. 4A and FIG. 4B, when voltage is applied to the lower electrodes SA1, SA2, SA3 and SA4 and the upper electrodes SC1, SC2, SC3, SC4 and SC5, the fine particles PC may move toward the lower electrodes SA1, SA2, SA3, and SA4 and may gather thereon.

Therefore, the vertical dimension by which the fine particles PC in the light control posts LCS may block the light may be made smaller, so that the light emitted from the pixels P passes in the lateral direction. Thus, the display panel 10 according to one embodiment of the present disclosure may have a wide viewing angle in both the vertical viewing angle and the horizontal viewing angle.

As the voltage difference between the voltages of the lower electrode and the upper electrode increases, the fine particles PC may move toward the lower electrode and may gather thereon in a more concentrated manner. Thus, a wider viewing angle may be realized.

Therefore, according to one embodiment of the present disclosure, by adjusting the voltage difference between the voltages of the lower electrode and the upper electrode the viewing angle of the display panel may be adjusted as needed.

Figure 5:
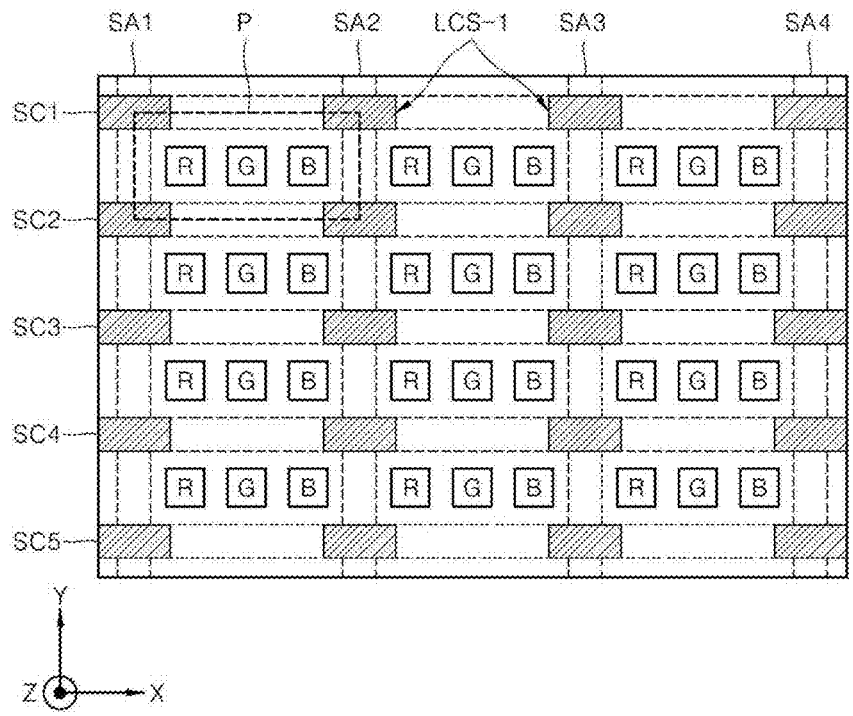
FIGS. 5 to 7 are plan views showing display panels according to embodiments of the present disclosure, respectively.
Figure 6:
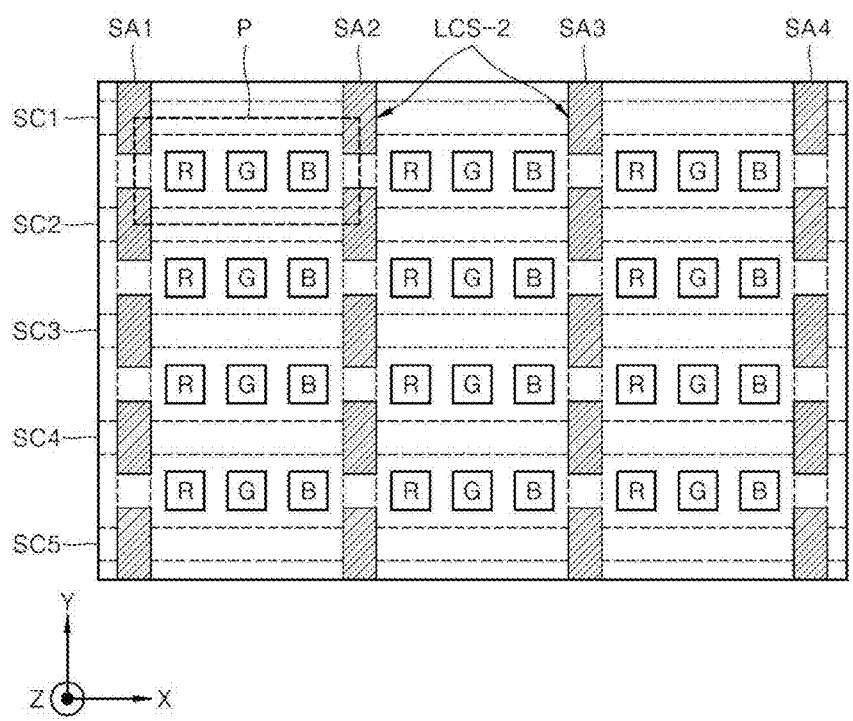
Figure 7:
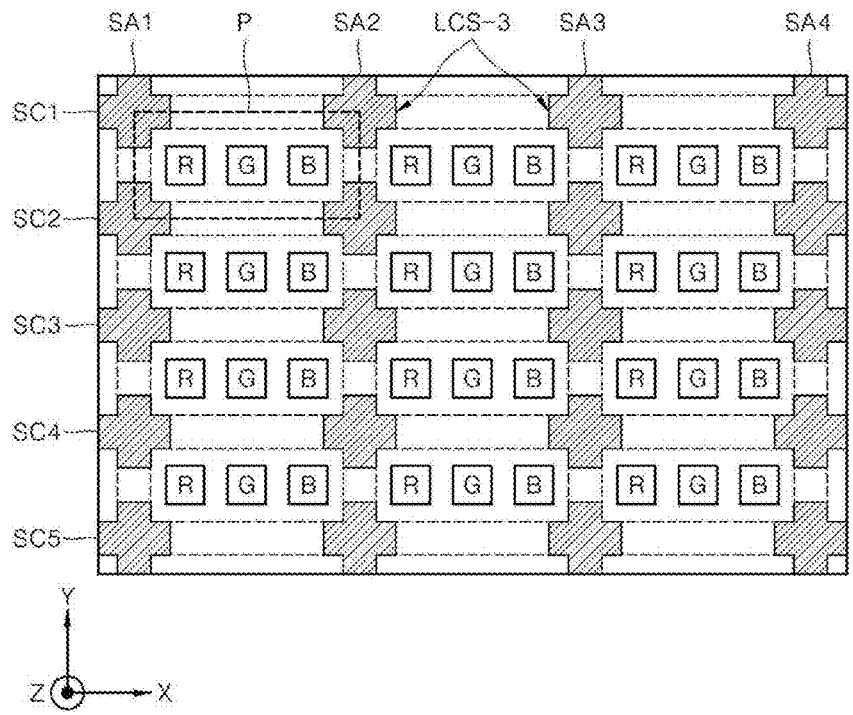

FIGS. 5 to 7 are plan views showing display panels according to embodiments of the present disclosure.

Referring to FIG. 5, each of light control posts LCS-1 may extend along the second direction, for example, the X-axis direction. According to this structure, an area of the light control post LCS-1 that blocks the light emitted in the vertical viewing angle direction increases. Thus, the vertical viewing angle of a display panel 10-1 according to the present embodiment may be narrower, compared to that in the display panel 10 shown in FIG. 1.

Referring to FIG. 6, each of light control posts LCS-2 may extend along the first direction, for example, the Y-axis direction. According to this structure, an area of each of the light control posts LCS-2 that blocks the light emitted in the horizontal viewing angle direction increases. Thus, the horizontal viewing angle of a display panel 10-2 according to the present embodiment may be narrower, compared to that in the display panel 10 shown in FIG. 1.

Referring to FIG. 7, each of light control posts LCS-3 may extend along the first direction, for example, the Y-axis direction and the second direction, for example, the X-axis direction. According to this structure, an area of each of the light control posts LCS-3 that blocks the light emitted in the vertical viewing angle direction and the horizontal viewing angle direction increases. Thus, each of the vertical viewing angle and the horizontal viewing angle of a display panel 10-3 according to the present embodiment may be narrower, compared to that in the display panel 10 shown in FIG. 1.

Figure 8:
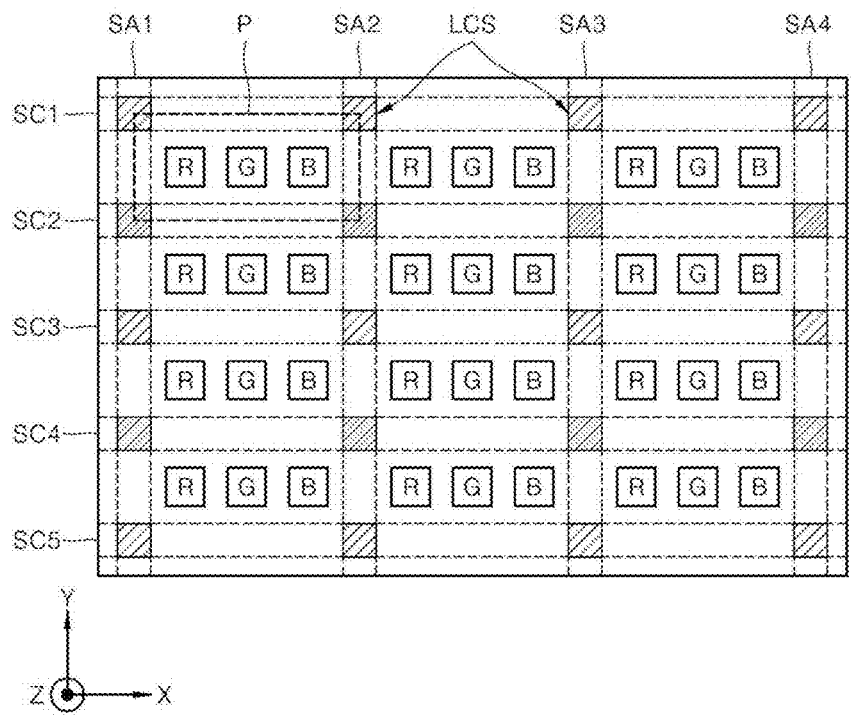
FIG. 8 and FIG. 9 show an example in which a vertical viewing angle is adjusted in a display panel according to one embodiment of the present disclosure.
Figure 9:
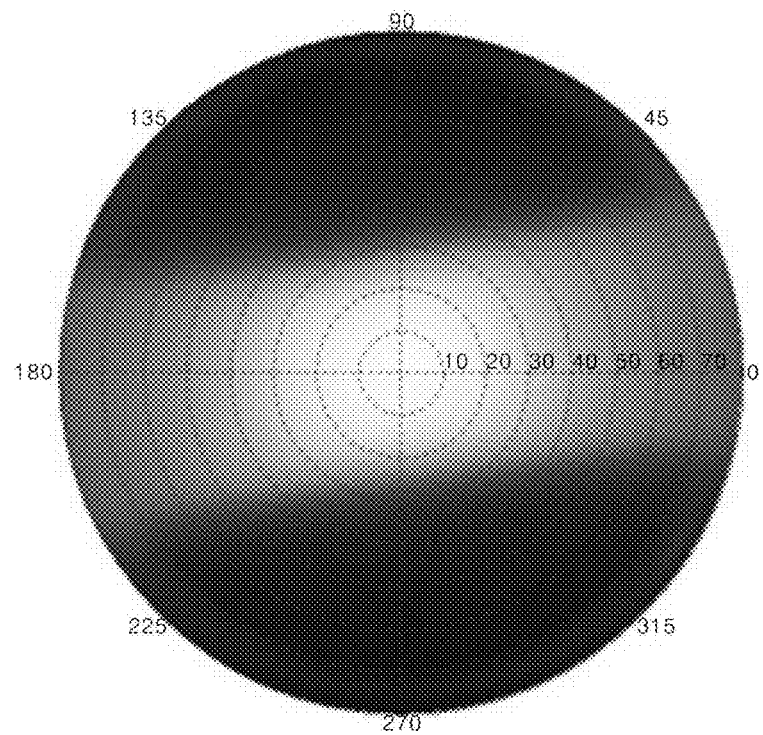

FIG. 8 and FIG. 9 show an example in which the vertical viewing angle is adjusted in the display panel 10 according to one embodiment of the present disclosure.

As shown in FIG. 8, all of the lower electrodes SA1, SA2, SA3 and SA4 may be selected, and a positive voltage may be applied thereto, while the first upper electrode SC1, the third upper electrode SC3 and the fifth upper electrode SC5 are selected among the upper electrodes SC1, SC2, SC3, SC4 and SC5, and a negative voltage may be applied thereto. In this case, the fine particles of each of the light control posts LCS disposed in each of the areas where the first upper electrode SC1 and the lower electrodes SA1, SA2, SA3 and SA4 intersect with each other, the areas where the third upper electrode SC3 and the lower electrodes SA1, SA2, SA3 and SA4 intersect with each other, and the areas where the fifth upper electrode SC5 and the lower electrodes SA1, SA2, SA3, and SA4 intersect may move toward each of the lower electrodes SA1, SA2, SA3 and SA4. Thus, the vertical viewing angle (cutoff angle of about 30 degrees) of the display panel 10 may be narrowed as shown in an optical profile shown in FIG. 9.

Figure 10:
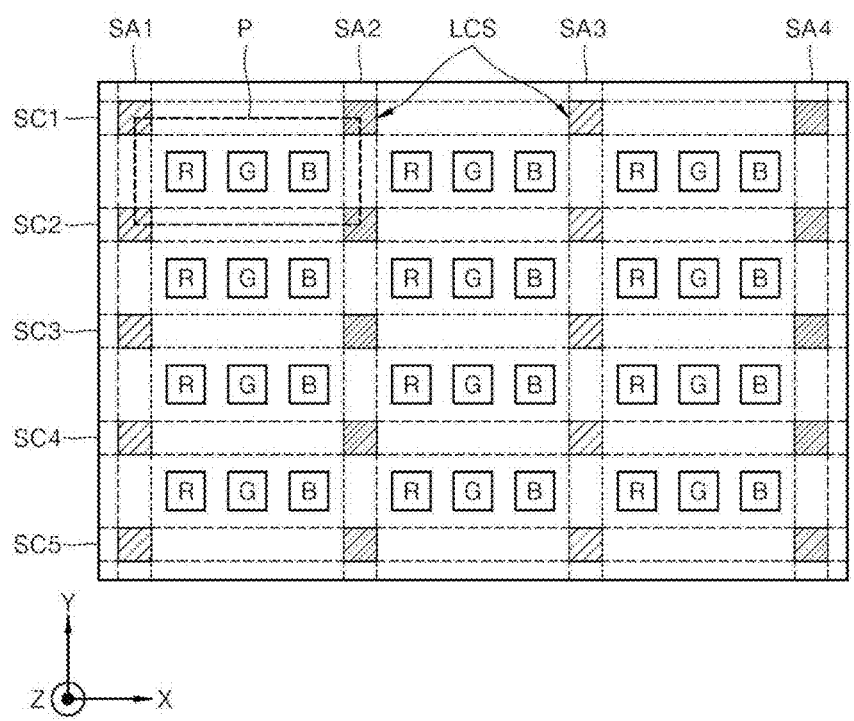
FIG. 10 and FIG. 11 show an example in which a horizontal viewing angle is adjusted in a display panel according to one embodiment of the present disclosure.
Figure 11:
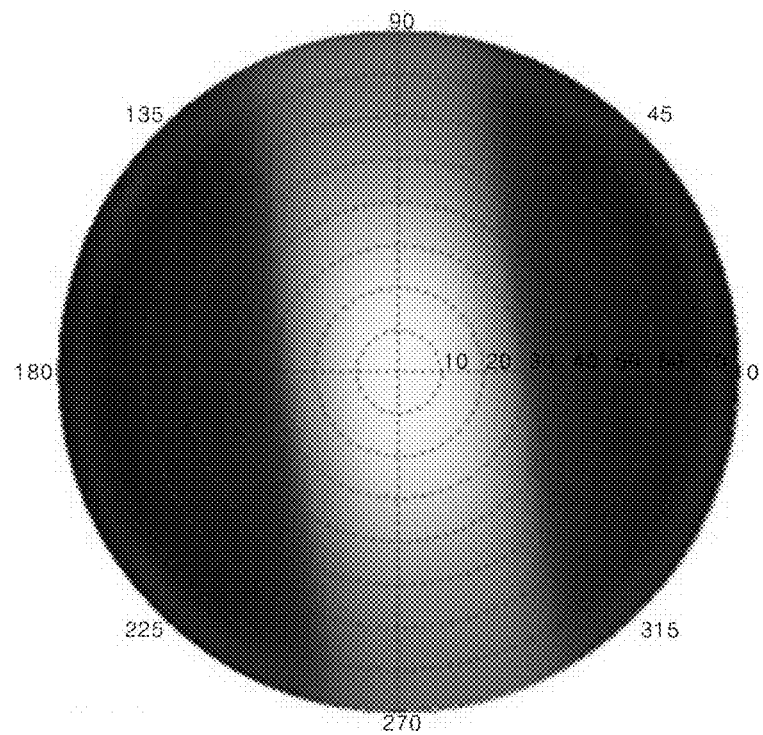

FIG. 10 and FIG. 11 show an example in which the horizontal viewing angle is adjusted in the display panel according to one embodiment of the present disclosure.

As shown in FIG. 10, the first lower electrode SA1 and the third lower electrode SA3 may be selected among the lower electrodes SA1, SA2, SA3, and SA4, and a positive voltage may be applied thereto, while all of the upper electrodes SC1, SC2, SC3, SC4, and SC5 may be selected, and a negative voltage may be applied thereto. In this case, the fine particles of each of the light control posts LCS disposed in each of the areas where the first lower electrode SA1 and the upper electrodes SC1, SC2, SC3, SC4 and SC5 intersect with each other, and the areas where the third lower electrode SA3 and the upper electrodes SC1, SC2, SC3, SC4 and SC5 intersect with each other may move toward each of the first lower electrode SA1 and the third lower electrode SA3. Therefore, the horizontal viewing angle (cutoff angle of about 30 degrees) of the display panel 10 may be narrowed as shown in the light profile shown in FIG. 11.

Figure 12:
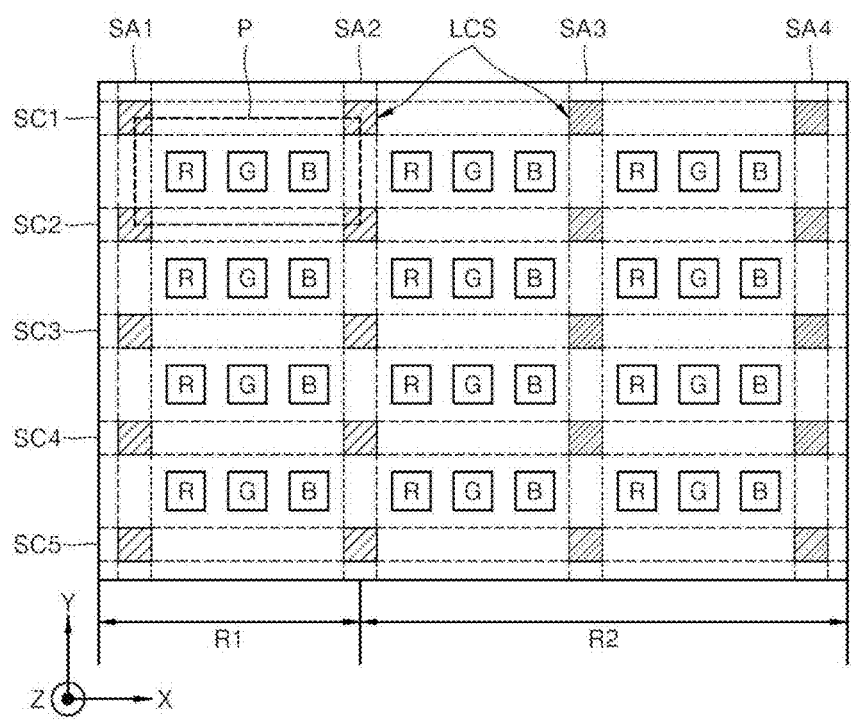
FIG. 12 and FIG. 13 show an example in which a viewing angle is adjusted based on each of a plurality of areas in a display panel according to one embodiment of the present disclosure.
Figure 13:
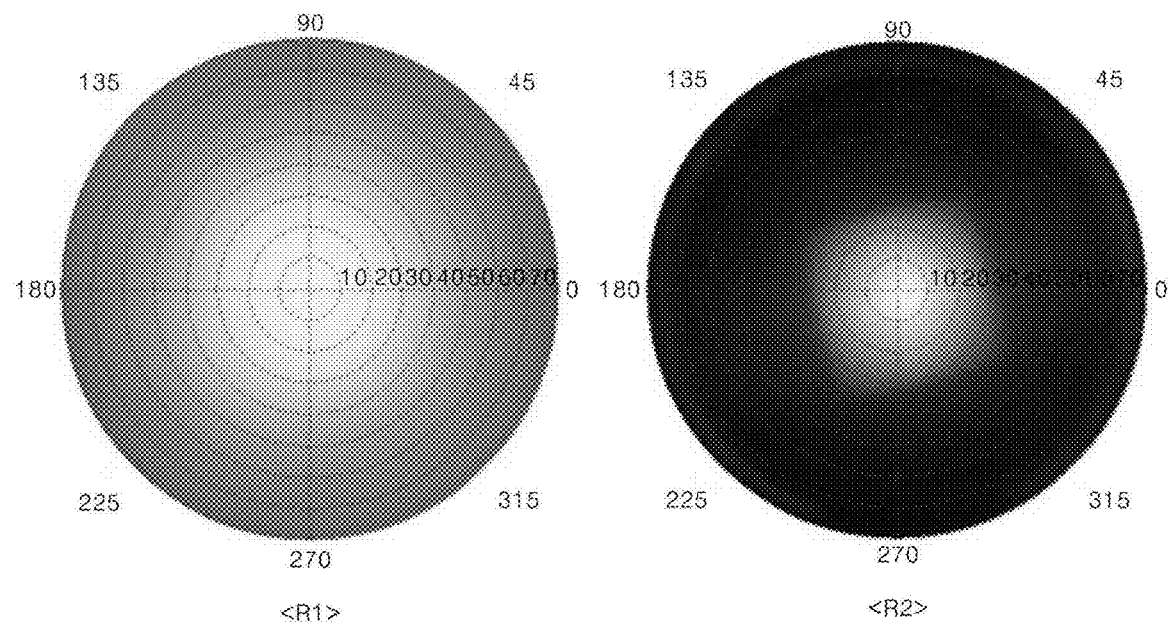

FIG. 12 and FIG. 13 show examples in which the viewing angle is adjusted based on each of a plurality of areas in the display panel according to one embodiment of the present disclosure.

As shown in FIG. 12, the lower electrodes located in the left area of the display panel 10, for example, the first lower electrode SA1 and the second lower electrode SA2 among the lower electrodes SA1, SA2, SA3, and SA4 may be selected, and a positive voltage may be applied to the selected ones. The lower electrodes located in the right area of the display panel 10, for example, the third lower electrode SA3 and the fourth lower electrode SA4 among the lower electrodes SA1, SA2, SA3, and SA4 may not be selected. All of the upper electrodes SC1, SC2, SC3, SC4 and SC5 may be selected, and the negative voltage may be applied thereto. In this case, the fine particles of the light control posts LCS disposed in the left area of the display panel 10 may move toward the lower electrodes, for example, the first lower electrode SA1 and the second lower electrode SA2, while the fine particles of the light control posts LCS disposed in the right area of the display panel 10 may be maintained in a dispersed state in the fluid. Therefore, as shown in the light profile shown in FIG. 13, the left area of the display panel 10 may have a wide viewing angle, and the right area of the display panel 10 may have a narrow viewing angle.

With reference to FIG. 12 and FIG. 13, it is described by way of example that the viewing angle of the left area of the display panel 10 may be adjusted to be different from that of the right area thereof. The present disclosure is not limited thereto. In another example, the viewing angle of an upper area of the display panel 10 may be adjusted to be different from that of a lower area thereof. In another example, the display panel 10 may be divided into at least three areas, and the viewing angles of the at least three areas may be adjusted to be different from each other.

Figure 14:
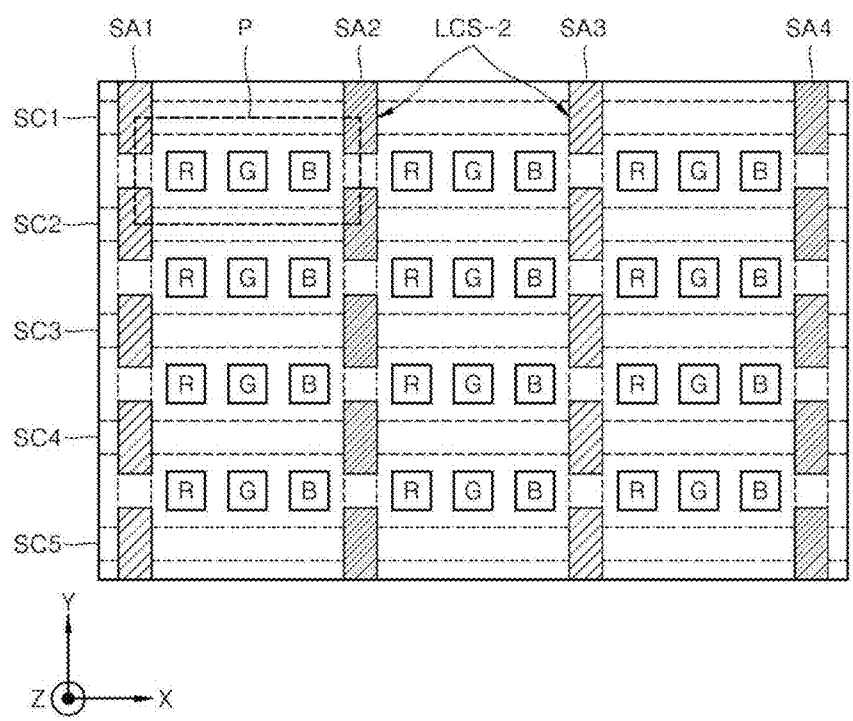
FIG. 14 and FIG. 15 show an example in which a horizontal viewing angle is adjusted in a display panel according to one embodiment of the present disclosure.
Figure 15:
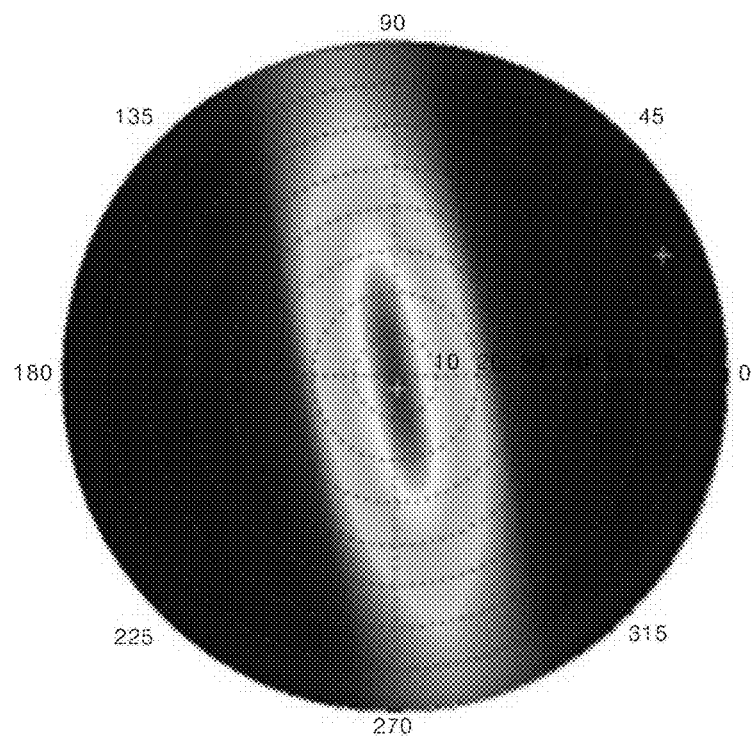

FIG. 14 and FIG. 15 show an example in which the horizontal viewing angle is adjusted in a display panel 10-2 according to one embodiment of the present disclosure.

Referring to FIG. 14, the display panel 10-2 includes light control posts LCS-2 extending along the first direction, for example, the Y-axis direction. Moreover, as shown in FIG. 14, the first lower electrode SA1 and the third lower electrode SA3 may be selected among the lower electrodes SA1, SA2, SA3 and SA4, and a positive voltage may be applied to the selected ones. All of the upper electrodes SC1, SC2, SC3, SC4 and SC5 may be selected and a negative voltage may be applied thereto. In this case, the fine particles of each of the light control posts LCS-2 disposed in each of the areas where the first lower electrode SA1 and the upper electrodes SC1, SC2, SC3, SC4 and SC5 intersect with each other, and each of the areas where the third lower electrode SA3 and the upper electrodes SC1, SC2, SC3, SC4 and SC5 intersect each other may move toward the first lower electrode SA1 and the third lower electrode SA3. Therefore, as shown in the light profile shown in FIG. 15, the horizontal viewing angle (cutoff angle of about 23 degrees) of the display panel 10-2 may be narrower, compared to that in the display panel 10.

Figure 16A:
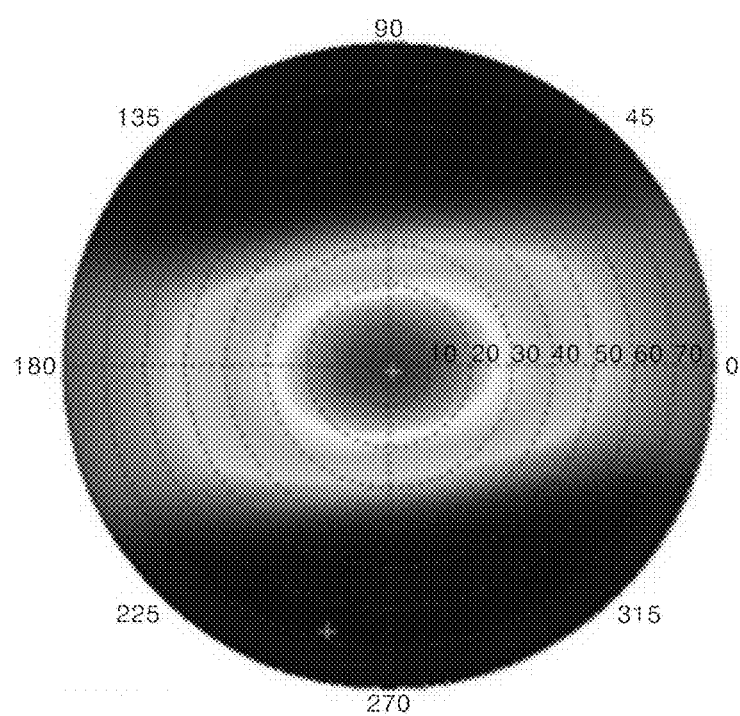
FIG. 16A to FIG. 16C respectively show light profiles based on change in a vertical dimension of a light control post in a display panel according to one embodiment of the present disclosure.
Figure 16B:
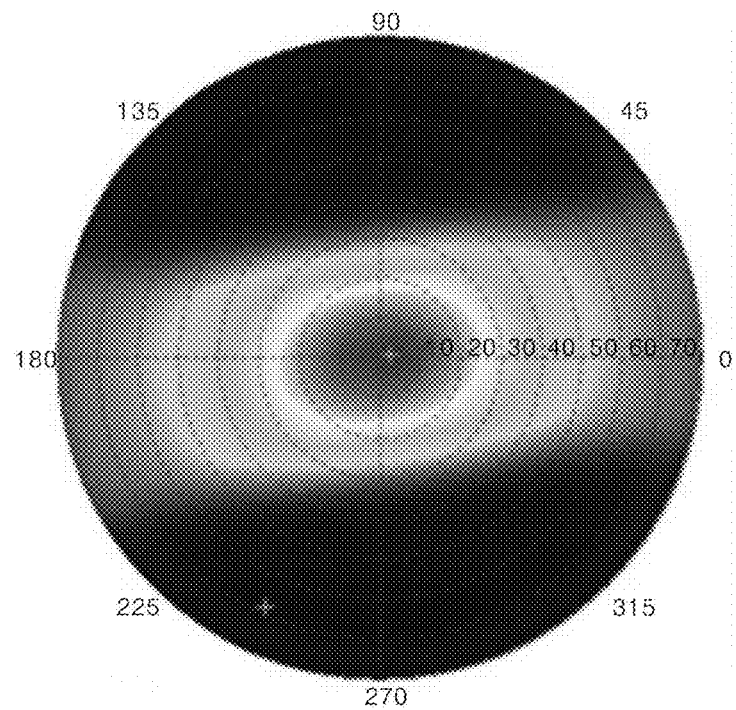
Figure 16C:
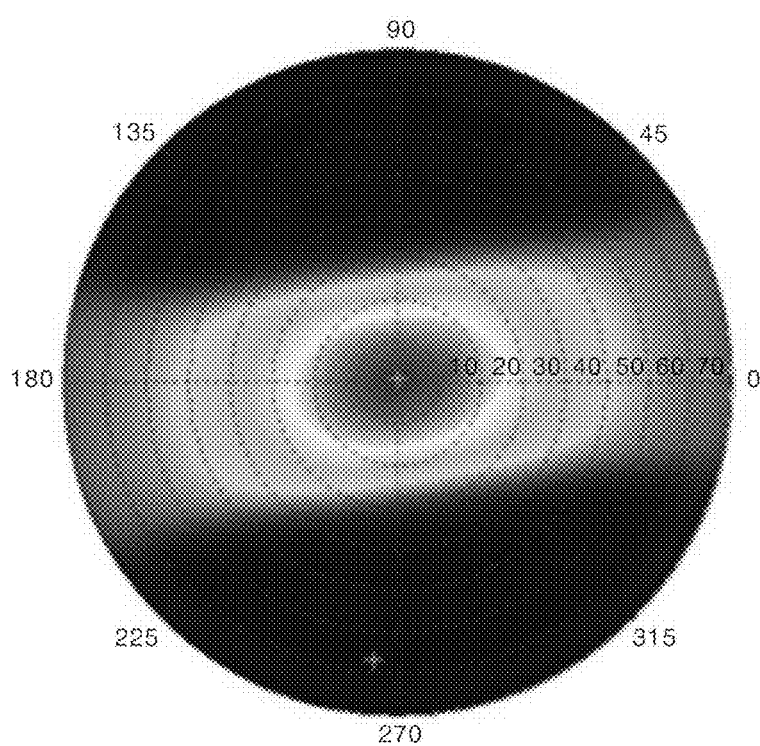

FIG. 16A to FIG. 16C show light profiles based on change in the vertical dimension of the light control post in the display panel according to one embodiment of the present disclosure.

FIG. 16A shows the vertical viewing angle of the display panel when the vertical dimension of the light control post is 70 μm, and FIG. 16B shows the vertical viewing angle of the display panel when the vertical dimension of the light control post is 80 μm. FIG. 16C shows the vertical viewing angle of the display panel when the vertical dimension of the light control post is 90 μm.

Referring to FIG. 16A to FIG. 16C, it may be identified that the vertical viewing angle becomes narrower as the vertical dimension of the light control post increases. In FIG.

16A, the cutoff angle is 34 degrees. In FIG. 16B, the cutoff angle is 31 degrees. In FIG. 16C, the cutoff angle is 28 degrees.

FIG. 17A to FIG. 17D are cross-sectional views to illustrate a method for manufacturing a display panel according to one embodiment of the present disclosure. FIGS. 17A to 17D are respectively cross-sectional views showing areas corresponding to a cut line II-II' in FIG. 1.

Figure 17A:
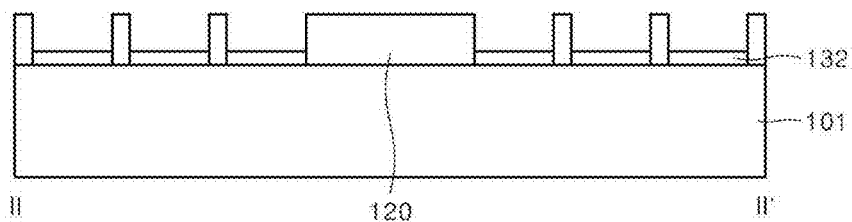
FIG. 17A to FIG. 17D are respectively cross-sectional views to illustrate a method for manufacturing a display panel according to one embodiment of the present disclosure.

Referring to FIG. 17A, the pixel electrodes 132 spaced apart from each other may be formed on a substrate 101. Next, the bank 120 having the openings defined therein exposing pixel electrodes 132 may be formed. The gate lines, the data lines, and the thin-film transistors may be formed on the substrate 101 before the pixel electrodes 132 are formed.

Figure 17B:
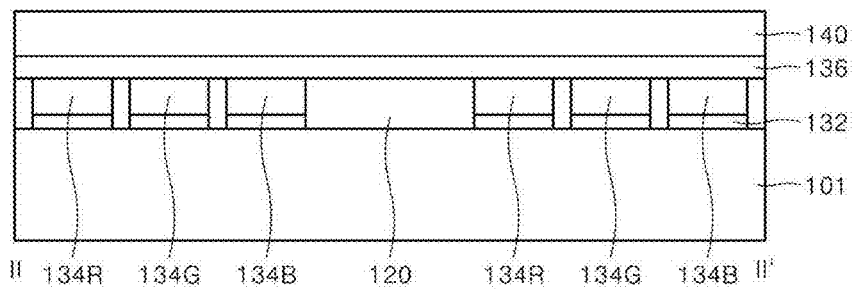

Referring to FIG. 17B, the red organic light-emitting layer 134R, the green organic light-emitting layer 134G, and the blue organic light-emitting layer 134B may be respectively formed in the openings of the bank 120. Next, the common electrode 136 covering the organic light-emitting layers 134R, 134G, 134B and the bank 120 may be formed. Next, the passivation layer 140 covering the common electrode 136 may be formed.

Figure 17C:
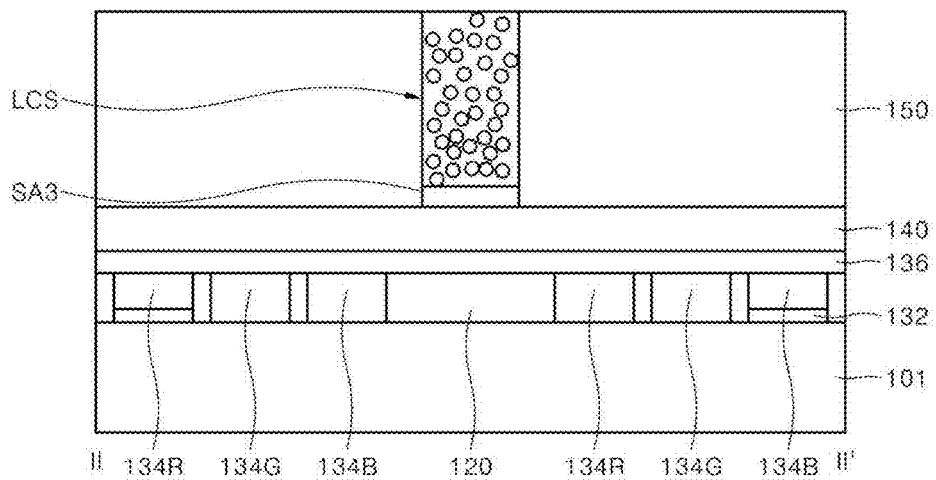
Figure 17D:
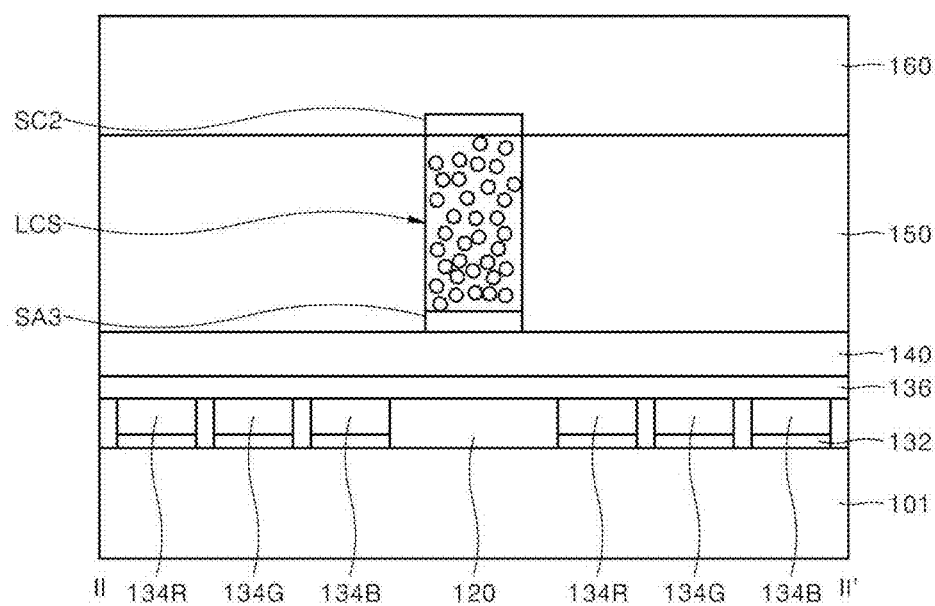

Referring to FIG. 17C, the lower electrodes including the third lower electrode SA3 may be formed on the passivation layer 140. The first encapsulation layer 150 having openings defined therein partially exposing the lower electrodes may be formed on passivation layer 140. Ink constituting the light control posts LCS may be injected into the openings of the first encapsulation layer 150 in an inkjet printing scheme. Next, the upper electrodes including the second upper electrode SC2 may be formed on the first encapsulation layer 150. Next, the second encapsulation layer 160 covering the first encapsulation layer 150 and the upper electrodes may be formed.

Unlike as previously described, in another embodiment, the lower electrodes may extend in the second direction, for example, the X-axis direction, and the upper electrodes may extend in the first direction, for example, the Y-axis direction.

Further, unlike as described above, in another embodiment, the fine particles of the light control posts may be positively charged, and a negative voltage may be selectively applied to the lower electrodes and a positive voltage may be selectively applied to the upper electrodes.

According to an embodiment of the present disclosure, a display panel comprises a plurality of pixels, wherein each of the plurality of pixels includes the plurality of sub-pixels; a bank defining a plurality of light-emitting areas corresponding to a plurality of sub-pixels: a plurality of lower electrodes disposed on the bank and extending in a first direction and along a boundary between the plurality of pixels: a plurality of light control posts disposed on the lower electrodes, wherein the plurality of light control posts are disposed around each of the plurality of pixels so as to control propagation of light: a first encapsulation layer surrounding the plurality of light control posts: a plurality of upper electrodes disposed on the plurality of light control posts and the first encapsulation layer, wherein the plurality of upper electrodes extends in a second direction intersecting the first direction and along the boundary between the plurality of pixels; and a second encapsulation layer covering the plurality of upper electrodes and the first encapsulation layer.

In some embodiments of the present disclosure, each of the plurality of light control posts is disposed at each of corners of the plurality of pixels.

In some embodiments of the present disclosure, each of the plurality of light control posts extends along the first direction.

In some embodiments of the present disclosure, each of the plurality of light control posts extends along the second direction.

In some embodiments of the present disclosure, each of the plurality of light control posts extends along the first direction and the second direction.

In some embodiments of the present disclosure, each of the plurality of light control posts includes a transparent fluid and fine particles dispersed in the fluid, wherein the particles are electrically charged and block light.

In some embodiments of the present disclosure, the fine particles are negatively electrically charged, wherein the plurality of lower electrodes respectively act as independently and selectively operating anodes, and wherein the plurality of upper electrodes respectively act as independently and selectively operating cathodes.

In some embodiments of the present disclosure, the display panel further comprises: a common electrode disposed on the bank; and a passivation layer disposed on the common electrode.

In some embodiments of the present disclosure, the plurality of lower electrodes are disposed on the passivation layer and are electrically insulated from the common electrode.

According to an embodiment of the present disclosure, a display panel comprises a plurality of pixels: a passivation layer covering organic light-emitting elements respectively disposed in the plurality of pixels: a plurality of lower electrodes disposed on the passivation layer and extending in a first direction and along a boundary between the plurality of pixels: a plurality of upper electrodes extending in a second direction intersecting the first direction and along the boundary between the plurality of pixels: a plurality of light control posts respectively disposed between the plurality of lower electrodes and the plurality of upper electrodes and in areas where the plurality of lower electrodes and the plurality of upper electrodes intersect each other, wherein the plurality of light control posts control propagation of light: a first encapsulation layer disposed under the plurality of upper electrodes and surrounding the plurality of light control posts; and a second encapsulation layer covering the plurality of upper electrodes and the first encapsulation layer.

In some embodiments of the present disclosure, the plurality of light control posts extend along at least one of the first direction or the second direction.

In some embodiments of the present disclosure, each of the plurality of light control posts includes a transparent fluid and fine particles dispersed in the fluid, wherein the particles are electrically charged and block light.

In some embodiments of the present disclosure, the display panel further comprises a common electrode disposed under the passivation layer, wherein the plurality of lower electrodes are electrically insulated from the common electrode by the passivation layer.

Although the embodiments of the present disclosure have been described above in more detail with reference to the accompanying drawings, the present disclosure is not necessarily limited to the embodiments, and various modifications may be made within the scope that does not deviate from the technical spirit of the present disclosure. Therefore, the embodiments as disclosed in the present disclosure are to illustrate the disclosure rather than limiting the technical idea of the present disclosure, and the scope of the technical idea of the present disclosure is not limited to the embodiments. Therefore, it should be understood that the embodiments as described above are illustrative in all respects and not restrictive. The protective scope of the present disclosure should be interpreted based on the claims, and all technical ideas within the scope equivalent thereto should be construed as being included in the scope of the present disclosure.

What is claimed is:

1. A display panel comprising:
   a plurality of pixels, wherein each of the plurality of pixels includes a plurality of sub-pixels;
   a bank defining a plurality of light-emitting areas corresponding to the plurality of sub-pixels;
   a common electrode of the sub-pixels;
   a passivation layer disposed directly on the common electrode;
   a plurality of lower electrodes disposed directly on the passivation layer and extending in a first direction and along a boundary between the plurality of pixels;
   a plurality of light control posts disposed on the lower electrodes, wherein the plurality of light control posts are disposed around each of the plurality of pixels so as to control propagation of light;
   a first encapsulation layer disposed directly on the passivation layer and surrounding the plurality of light control posts;
   a plurality of upper electrodes disposed on the plurality of light control posts and the first encapsulation layer, wherein the plurality of upper electrodes extend in a second direction intersecting the first direction and along a boundary between the plurality of pixels; and
   a second encapsulation layer covering the plurality of upper electrodes and the first encapsulation layer.

2. The display panel of claim 1, wherein each of the plurality of light control posts is disposed at each of corners of the plurality of pixels.

3. The display panel of claim 2, wherein each of the plurality of light control posts extends along the first direction.

4. The display panel of claim 2, wherein each of the plurality of light control posts extends along the second direction.

5. The display panel of claim 2, wherein each of the plurality of light control posts extends along the first direction and the second direction.

6. The display panel of claim 1, wherein each of the plurality of light control posts includes a transparent fluid and fine particles in the fluid, wherein the particles are electrically charged and block light.

7. The display panel of claim 6, wherein the fine particles are negatively electrically charged,
   wherein the plurality of lower electrodes respectively act as independently and selectively operating anodes, and
   wherein the plurality of upper electrodes respectively act as independently and selectively operating cathodes.

8. The display panel of claim 1, wherein the plurality of lower electrodes are electrically insulated from the common electrode.

9. A display panel comprising:
   a plurality of pixels;
   a bank defining a plurality of light-emitting areas corresponding to a plurality of sub-pixels of each of the pixels;
   a common electrode of the sub-pixels;
   a passivation layer disposed directly on the common electrode and covering organic light-emitting elements respectively disposed in the plurality of pixels;
   a plurality of lower electrodes disposed directly on the passivation layer and extending in a first direction and along a boundary between the plurality of pixels;
   a plurality of upper electrodes extending in a second direction intersecting the first direction and along a boundary between the plurality of pixels;
   a plurality of light control posts respectively disposed between the plurality of lower electrodes and the plurality of upper electrodes and in areas where the plurality of lower electrodes and the plurality of upper electrodes intersect each other to control propagation of light;
   a first encapsulation layer disposed directly on the passivation layer and under the plurality of upper electrodes and surrounding the plurality of light control posts; and
   a second encapsulation layer covering the plurality of upper electrodes and the first encapsulation layer.

10. The display panel of claim 9, wherein the plurality of light control posts extend along at least one of the first direction or the second direction.

11. The display panel of claim 9, wherein each of the plurality of light control posts includes a transparent fluid and fine particles in the fluid, wherein the particles are electrically charged and block light.

12. A method for adjusting a viewing angle of the display panel of claim 1, the method comprising:
    adjusting a horizontal viewing angle or a vertical viewing angle by adjusting a voltage difference between voltages of the plurality of upper electrodes and voltages of the plurality of lower electrodes.

13. The method of claim 12, wherein the adjusting of the voltage difference comprises:
    selecting several or all upper electrodes of the plurality of upper electrodes to apply a positive or a negative voltage and selecting several or all lower electrodes of the plurality of lower electrodes to apply a voltage with an opposite polarity to the voltage applied to the several or all upper electrodes.

14. The method of claim 13, wherein the vertical viewing angle of the display panel is narrowed by selecting all lower electrodes to apply a positive voltage and selecting the several upper electrodes of the plurality of upper electrodes to apply the negative voltage.

15. The method of claim 13, wherein the horizontal viewing angle of the display panel is narrowed by selecting the several lower electrodes of the plurality of lower electrodes to apply the positive voltage and selecting all the upper electrodes to apply the negative voltage.

16. The method of claim 13, wherein a left area and a right area of the display panel have wide or narrow viewing angles, respectively, by selecting lower electrodes of the plurality of the lower electrodes located in the left area or the right area of the display panel to apply the positive voltage and selecting all the upper electrodes to apply the negative voltage.

17. The method of claim 13, wherein an upper area and a lower area of the display panel have wide or narrow viewing angles, respectively, by selecting lower electrodes of the plurality of the lower electrodes located in the upper area or the lower area of the display panel to apply the positive voltage and selecting all the upper electrodes to apply the negative voltage.

18. A display device including the display panel of claim 1.

* * * * *